(12) United States Patent
Koide

(10) Patent No.: US 10,197,875 B2
(45) Date of Patent: Feb. 5, 2019

(54) DISPLAY DEVICE

(71) Applicant: Japan Display Inc., Minato-ku (JP)

(72) Inventor: Gen Koide, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/656,098

(22) Filed: Jul. 21, 2017

(65) Prior Publication Data
US 2018/0031932 A1 Feb. 1, 2018

(30) Foreign Application Priority Data

Jul. 29, 2016 (JP) .................................. 2016-149614

(51) Int. Cl.
| | |
|---|---|
| *H01L 27/12* | (2006.01) |
| *H01L 21/48* | (2006.01) |
| *G02F 1/1362* | (2006.01) |
| *G02F 1/1333* | (2006.01) |
| *G02F 1/1339* | (2006.01) |
| *H01L 29/786* | (2006.01) |

(52) U.S. Cl.
CPC ...... *G02F 1/136227* (2013.01); *G02F 1/1339* (2013.01); *G02F 1/133345* (2013.01); *G02F 1/136286* (2013.01); *H01L 27/124* (2013.01); *G02F 1/13338* (2013.01); *G02F 2001/133388* (2013.01); *H01L 29/78645* (2013.01)

(58) Field of Classification Search
CPC ....... H01L 21/285; H01L 21/48; H01L 27/12; H01L 27/124; H01L 21/02063; H01L 21/28506
See application file for complete search history.

(56) References Cited

U.S. PATENT DOCUMENTS

| | | | | |
|---|---|---|---|---|
| 2008/0146680 A1* | 6/2008 | Sato | ...................... | B22F 1/0018 516/31 |
| 2011/0316810 A1* | 12/2011 | Tsujino | ............... | G02F 1/13338 345/174 |
| 2013/0092520 A1* | 4/2013 | Lee | .......................... | G06F 3/044 200/600 |
| 2014/0198267 A1* | 7/2014 | Jeong | ..................... | G06F 3/041 349/12 |
| 2014/0375907 A1* | 12/2014 | Wu | ....................... | G06F 3/0412 349/12 |

(Continued)

FOREIGN PATENT DOCUMENTS

| | | |
|---|---|---|
| JP | 2002-040465 | 2/2002 |
| JP | 2007-011030 | 1/2007 |

*Primary Examiner* — Fazli Erdem
(74) *Attorney, Agent, or Firm* — Oblon, McClelland, Maier & Neustadt, L.L.P.

(57) ABSTRACT

According to one embodiment, a display device includes a first substrate including a first basement, a scanning line and a signal line, arranged in a display area, a first organic insulating layer covering the signal line, a metal layer provided above the first organic insulating layer, and a first conductive layer arranged in a peripheral area surrounding the display area and formed from a same material as that of the metal layer, a second substrate including a second basement opposing the first conductive layer and spaced therefrom, and a second conductive layer, and including a first hole which penetrates the second basement, and a connecting material which electrically connects the first conductive layer and the second conductive layer via the first hole.

18 Claims, 12 Drawing Sheets

(56) References Cited

U.S. PATENT DOCUMENTS

| | | | |
|---|---|---|---|
| 2016/0034081 A1* | 2/2016 | Ichiki | G06F 3/044 |
| | | | 345/173 |
| 2016/0155777 A1* | 6/2016 | Kabe | H01L 27/32 |
| | | | 257/89 |
| 2016/0293451 A1* | 10/2016 | Koelling | B22F 1/0014 |
| 2017/0269437 A1* | 9/2017 | Chen | G02F 1/134309 |
| 2017/0271421 A1* | 9/2017 | Jinbo | H01L 27/3258 |

\* cited by examiner

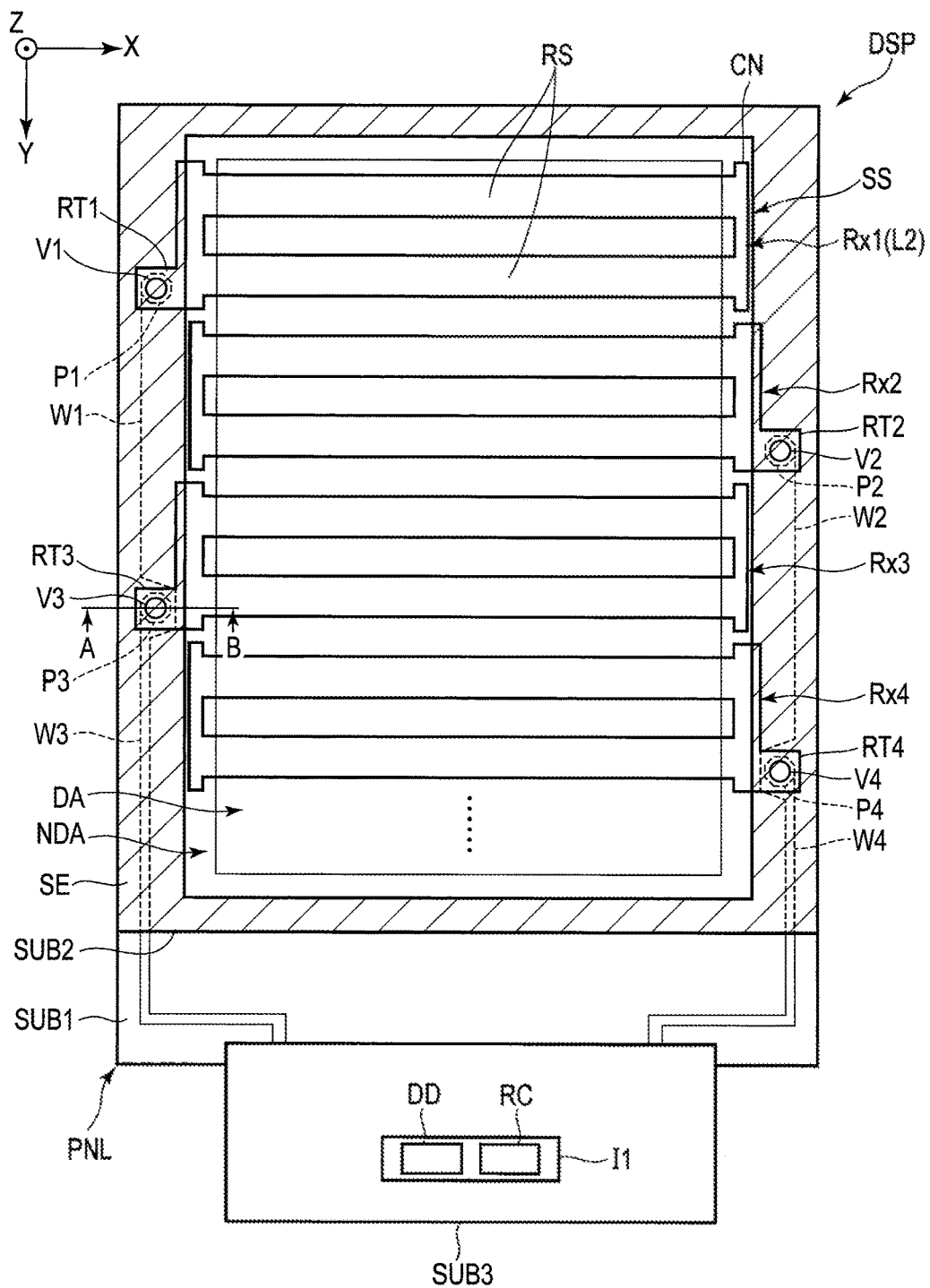
F I G. 1

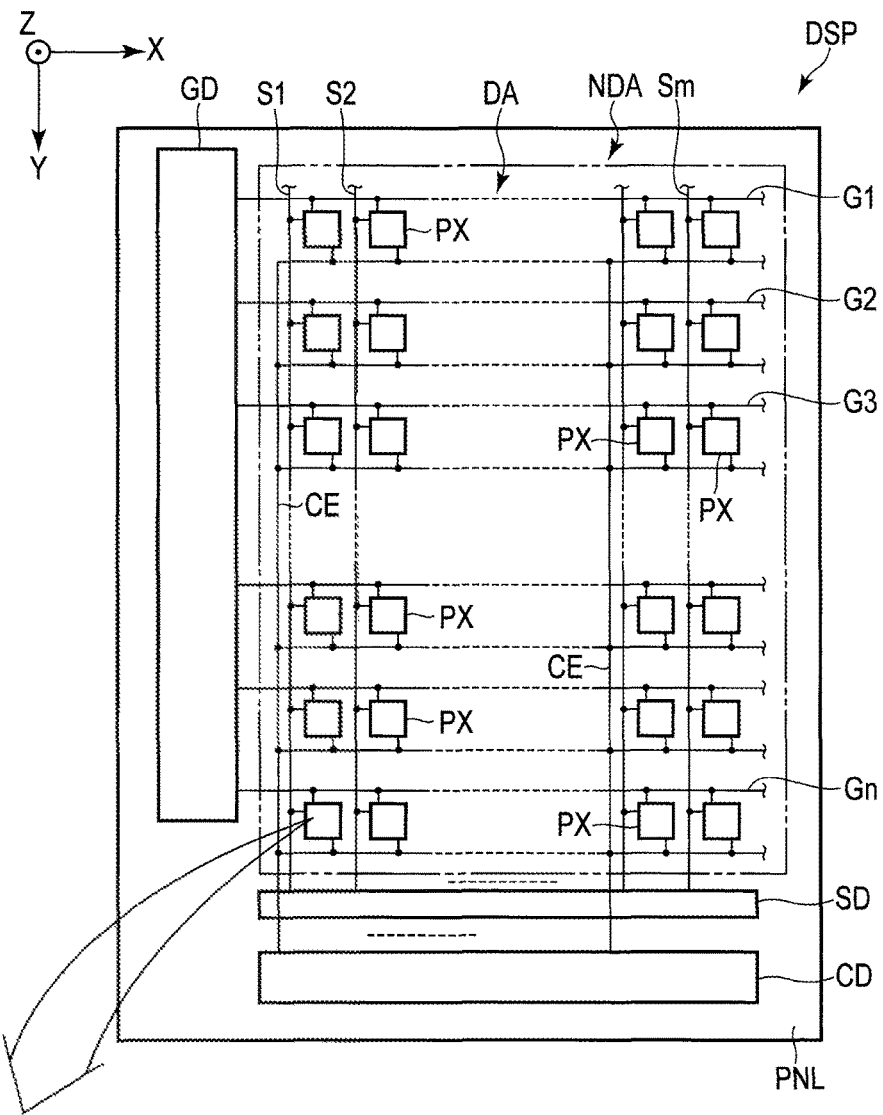
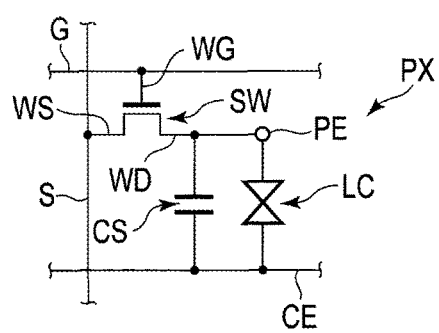
F I G. 2

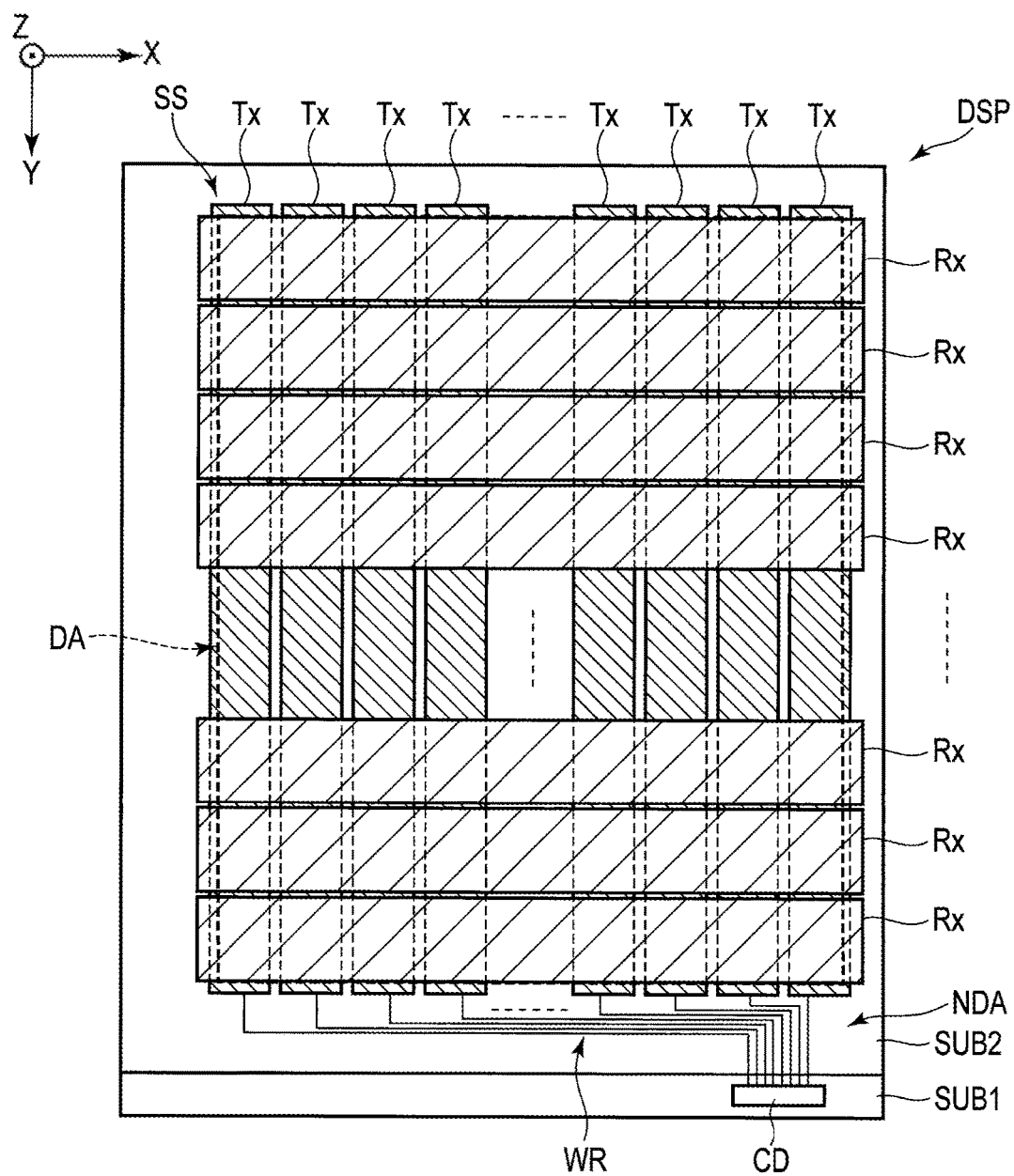
F I G. 5

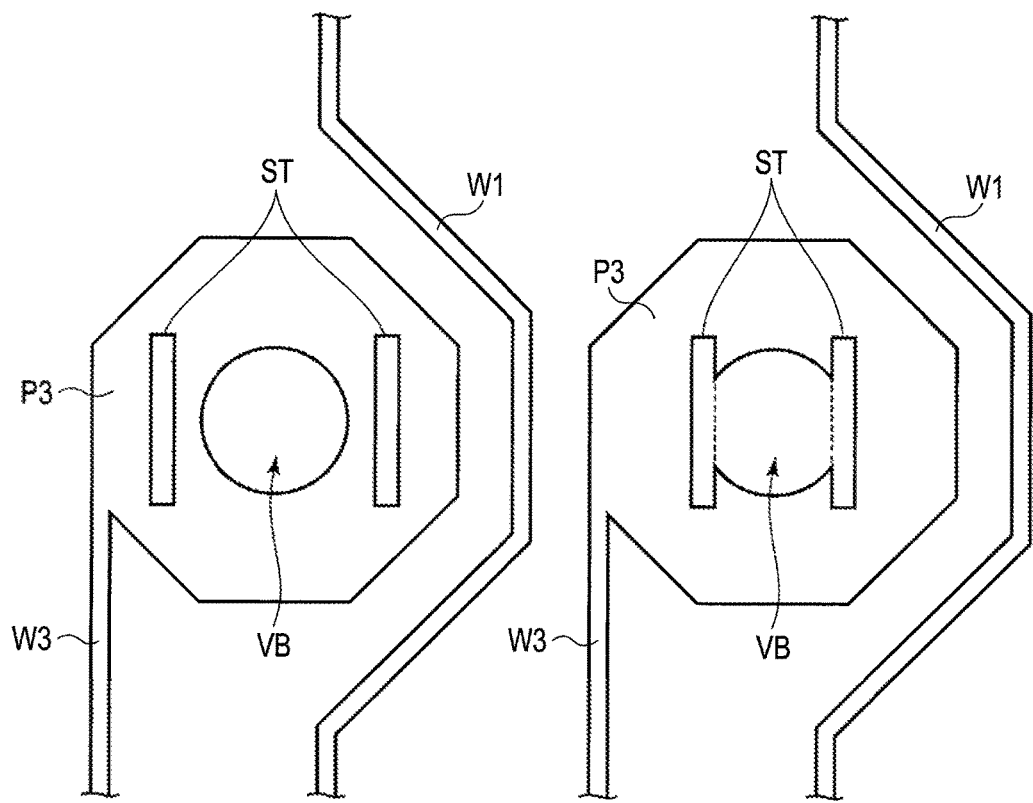
F I G. 7A  F I G. 7B

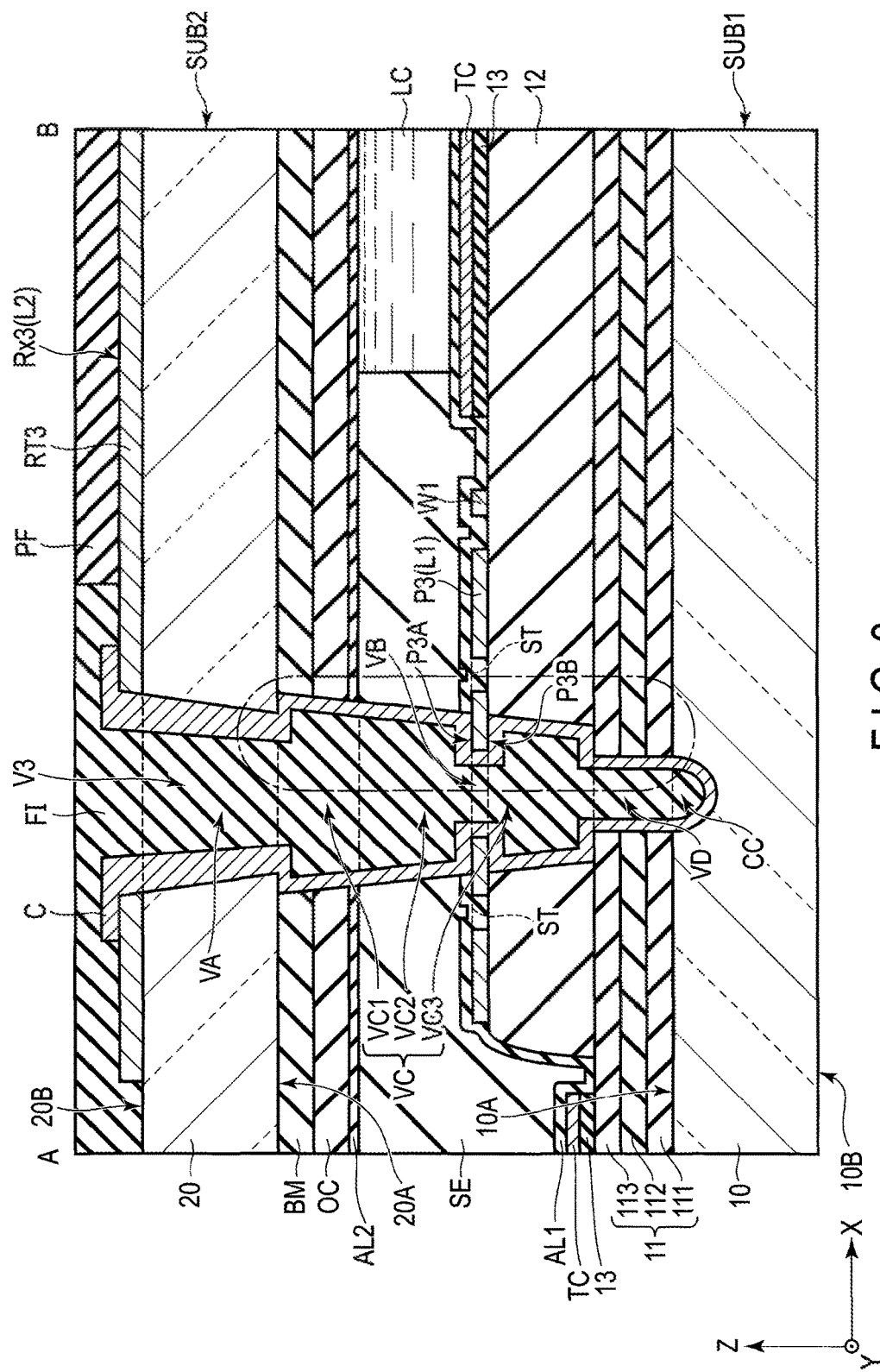
F I G. 8

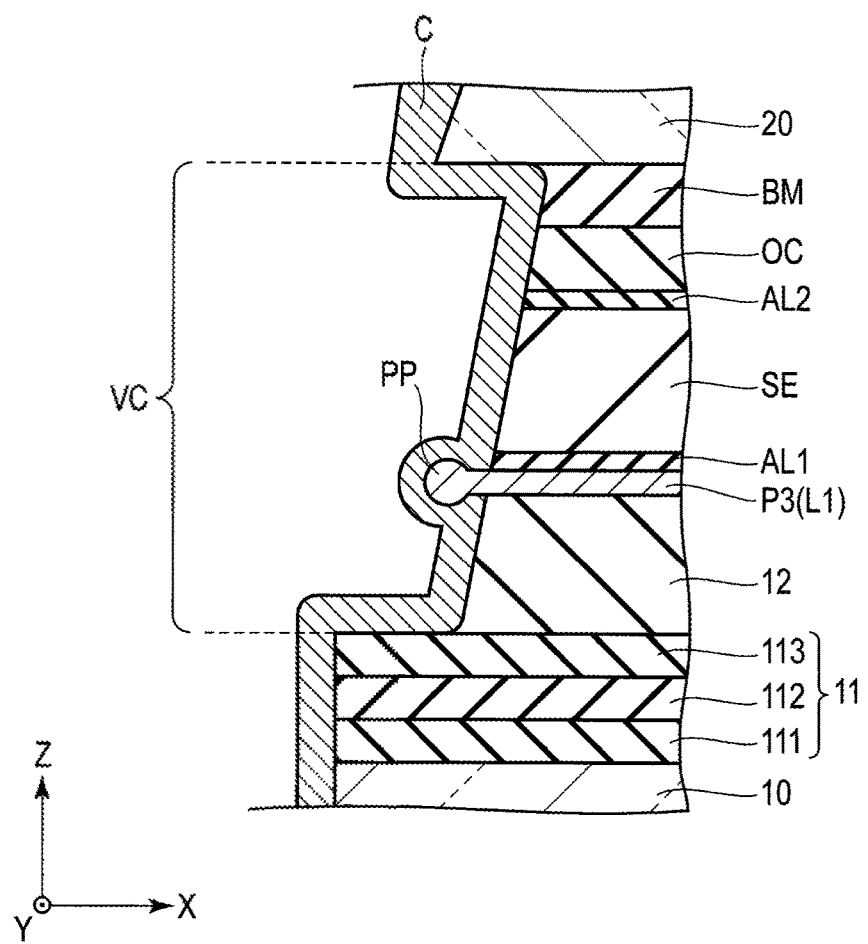
F I G. 9

DISPLAY DEVICE

CROSS-REFERENCE TO RELATED APPLICATIONS

This application is based upon and claims the benefit of priority from Japanese Patent Application No. 2016-149614, filed Jul. 29, 2016, the entire contents of which are incorporated herein by reference.

FIELD

Embodiments described herein relate generally to a display device.

BACKGROUND

In recent years, various techniques for reducing the width of the frame in display devices have been studied. One example discloses a technique of utilizing an inter-substrate connecting material which electrically connects a wiring portion comprising a connecting material inside a hole which penetrates an inner surface and an outer surface of a resin-made first substrate, and a wiring portion provided on an inner surface of a resin-made second substrate to each other.

BRIEF DESCRIPTION OF THE DRAWINGS

FIG. 1 is a plan view schematically showing a display device according to a first embodiment.

FIG. 2 is an equivalent circuit of the display device shown in FIG. 1.

FIG. 5 is a plan view schematically showing a sensor mounted in the display device shown in FIG. 1.

FIG. 7A is an expanded plan view showing a pad shown in FIG. 1.

FIG. 7B is an expanded plan view showing another example of the pad shown in FIG. 1.

FIG. 8 is a cross section schematically showing a non-display area of the display device shown in FIG. 1.

FIG. 9 is a cross section showing schematically an edge portion of the pad shown in FIG. 8.

DETAILED DESCRIPTION

Figure 3:
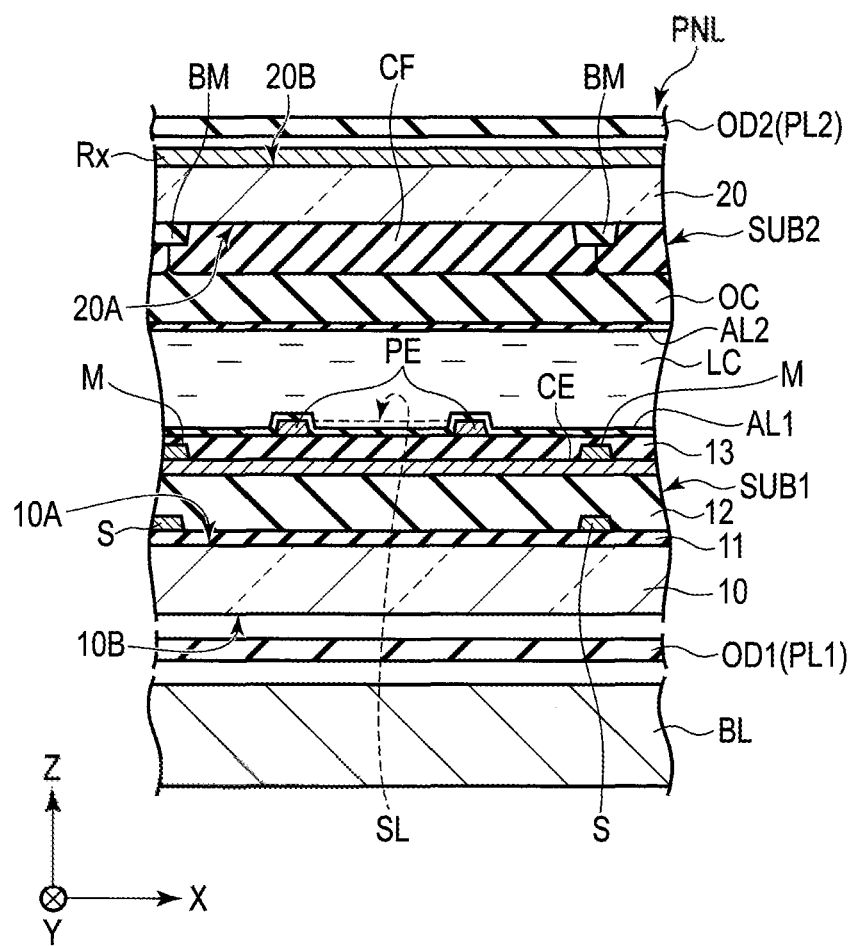
FIG. 3 is a cross section schematically showing a display area of the display device shown in FIG. 1.

In general, according to one embodiment, a display device comprises a first substrate including a first basement, a scanning line and a signal line, arranged in a display area which displays images, a first organic insulating layer covering the signal line, a metal layer provided above the first organic insulating layer, and a first conductive layer arranged in a peripheral area surrounding the display area and formed from a same material as that of the metal layer; a second substrate including a second basement opposing the first conductive layer and spaced therefrom, and a second conductive layer, and comprising a first hole which penetrates the second basement; and a connecting material which electrically connects the first conductive layer and the second conductive layer via the first hole.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

First Embodiment

The display device of this embodiment can be used in various devices such as smartphones, tablet computers, mobile phones, notebook computers, and game consoles. The main structure described in the present embodiment is applicable to a liquid crystal display device, a self-luminous display device such as an organic electroluminescent display device, an electronic paper display device comprising an electrophoresis element, etc., a display device adopting micro-electromechanical systems (MEMS), and a display device adopting electrochromism.

FIG. 1 is a plan view showing a configuration example of a display device DSP of this embodiment. Here, as an example of the display device DSP, a liquid crystal display device equipped with a sensor SS will be described.

As shown in FIG. 1, the first direction X, the second direction Y and the third direction Z are orthogonal to each other, but the first direction X and the second direction Y may intersect at an angle other than 90 degrees. The first direction X and the second direction Y correspond to the directions parallel to the surface of a substrate which constitutes the display device DSP. For example, the first direction X is parallel to short edges of the display device DSP, and the second direction Y is parallel to long edges of the display device DSP. The third direction Z corresponds to a thickness direction of the display device DSP.

In the following explanation, the third direction is referred to as upward (or merely above), and an opposite direction to the third direction Z is referred to as downward (or merely below). Further, such expressions as "the second member above the first member" and "the second member below the first member", the second member may be in contact with the first member or may be separated from the first member. In the case of the latter, the third member may be interposed between the first member and the second member. On the other hand, such expression as "the second member on the first member" and "the second member under the first component", the second member is in contact with the first member. Viewing an X-Y plane defined by the first direction X and the second direction Y from the opposite direction to the third direction Z is referred to as plan view. Viewing the display device DSP cut along an X-Z plane defined by the first direction X and the third direction Z or along a Y-Z plane defined by the second direction Y and the third direction Z is referred to as sectional view.

FIG. 1 is a plan view partially showing the display device DSP in the X-Y plane defined by the first direction X and the second direction Y. The display device DSP comprises a display panel PNL, an IC chip I1, a wiring substrate SUB3, etc.

The display panel PNL is a liquid crystal display panel, and includes a first substrate SUB1, a second substrate SUB2, a sealant SE, and a display function layer (liquid crystal layer LC which will be described later). The first substrate SUB1 and the second substrate SUB2 oppose each other along the third direction Z. In the example illustrated, the second substrate SUB2 is provided above the first substrate SUB1. The sealant SE is provided in a region indicated by hatching of slashing lines in FIG. 1, and the first substrate SUB1 and the second substrate SUB2 are adhered to each other by the sealant SE. The display function layer is held between the first substrate SUB1 and the second substrate SUB2.

The display panel PNL includes a display area DA and a non-display area (peripheral area) NDA. The display area DA is a region which displays images and is located on an inner section surrounded by the sealant SE. The non-display area NDA surrounds the display area DA. The sealant SE is located on the non-display area NDA.

The wiring substrate SUB3 is mounted on the first substrate SUB1. The wiring substrate SUB3 is, for example, a flexible substrate with flexibility. A flexible substrate applicable to the present embodiment should only be of a type which at least partially includes a flexible portion formed of a flexible material. For example, the wiring substrate SUB3 of the present embodiment may be a flexible substrate which is entirely formed as a flexible portion, or may also be a rigid flexible substrate which includes a rigid portion formed of a hard material such as glass epoxy and a flexible portion formed of a flexible material such as polyimide.

The IC chip I1 is mounted on the wiring substrate SUB3. Note that the IC chip I1 is not limited to the example shown in the drawing and may be mounted on the first substrate SUB1 which extends out from the second substrate SUB2 or may be mounted on an external circuit board connected to the wiring substrate SUB3. The IC chip I1 contains, for example, a display driver DD built therein, which outputs a signal necessary to display an image. The display driver DD described here includes at least a part of a signal line driver SD, a scanning line driver GD, and a common electrode driver CD, which will be described later. In the example illustrated, the IC chip I1 contains a detection circuit RC built therein, which functions as a touch panel controller or the like. The detection circuit RC may be incorporated in some other IC chip than the IC chip I1.

The display panel PNL may be, for example, a transmissive display panel which has a transmissive display function of displaying an image by selectively transmitting light from below the first substrate SUB1 (an opposite side to the display surface), a reflective display panel which has a reflective display function of displaying an image by selectively reflecting light from above the second substrate SUB2 (a display surface side), or a transreflective display panel which has the transmissive display function as well as the reflective display function.

The sensor SS installed on the display device DSP senses an object touching on or approaching to the display device DSP. The sensor SE comprises a plurality of detection electrodes Rx (Rx1, Rx2, ...). The detection electrodes Rx are provided on the second substrate SUB2. The detection electrodes Rx each extend along the first direction X, and are arranged to be spaced from each other along the second direction Y. While FIG. 1 illustrates detection electrodes Rx1 to Rx4 as the detection electrodes Rx, the detection electrode Rx1 is focused on to describe an example of the configuration thereof.

That is, the detection electrode Rx1 comprises detectors RS, a terminal RT1 and a connector CN.

The detector RS is located in the display area DA and extends along the first direction X. In the detection electrode Rx1, the detector RS is mainly used for sensing. In the example illustrated, although the detector RS is formed in a strip shape, more specifically, the detector RS is formed of an aggregate of fine metal wires as will be explained later with reference to FIG. 5. One detection electrode Rx1 comprises two detectors RS but may comprise three or more detectors RS or one detector RS.

The terminal RT1 is located on one end side of the non-display area NDA along the first direction X and is connected to the detectors RS. The connector CN is located on the other end side of the non-display area NDA along the first direction X and connects the detectors RS to each other. In FIG. 1, one end side corresponds to the left side with respect to the display area DA, and the other side corresponds to the right side with respect to the display area DA. A part of the terminal RT1 is formed in a position which overlaps the sealant SE in plan view.

On the other hand, the first substrate SUB1 includes a pad P1 and a wiring line W1. The pad P1 and the wiring line W1 are located on the one end side of the non-display area NDA, and overlap the sealant SE in plan view. The pad P1 is formed in a position which overlaps the terminal RT1 in plan view. The wiring line W1 is connected to the pad P1 and extends along the second direction Y to be electrically connected to the detection circuit RC of the IC chip I1 via the wiring substrate SUB3.

In this embodiment, pads P (P1, P2, ...) may be referred to as a first conductive layer L1, and detection electrodes Rx (Rx1, Rx2, ...) may be referred to as a second conductive layer L2. The display panel PNL comprises contact holes V (V1, V2, ...) for connecting the first conductive layer L1 and the second conductive layer L2 to each other in the non-display area NDA.

The contact hole V1 is formed in a position where the terminal RT1 and the pad P1 are opposed to each other. Further, the contact hole V1 may penetrate the second substrate SUB2 including the terminal RT1 and the sealant SE and may also penetrate the pad P1. In the example illustrated, the contact hole V1 is circular in plan view, but the shape thereof is not limited to that of the example illustrated, but may be some other shape such as elliptical. A connecting material is provided in the contact hole V1 to electrically connect the terminal RT1 and the pad P1 to each other. Thereby, the detection electrode Rx1 provided in the second substrate SUB2 is electrically connected to the detector RC via the wiring substrate SUB3 connected to the first substrate SUB1. The detector RC reads the sensor signal output from the detection electrode Rx, and detects whether an object touching or approaching or not, the position coordinate of an object, etc.

In the example illustrated, the odd-numbered terminals RT1, RT3, . . . , of the respective odd-numbered detection electrodes Rx1, Rx3, . . . , the pads P1, P3, . . . , the wiring lines W1, W3, . . . , and the contact holes V1, V3, . . . , are all located in the one end side of the non-display area NDA. On the other hand, the even-numbered terminals RT2, RT4, . . . , of the respective even-numbered detection electrodes Rx2, Rx4, . . . , the pads P2, P4, . . . , the wiring lines W2, W4, . . . , and the contact holes V2, V4, . . . , are all located in the other end side of the non-display area NDA. With such a layout, the width of one end side of the non-display area NDA and the width of the other end side can be equalized, thereby making it easier to reduce the width of the frame.

As illustrated in the drawing, in the layout in which the pad P3 is closer to the wiring substrate SUB3 than the pad P1, the wiring line W1 detours around an inner side of the pad P3 (i.e., the side close to the display area DA) and is arranged on an inner side of the wiring line W3 between the pad P3 and the wiring substrate SUB3. Similarly, the wiring line W2 detours around an inner side of the pad P4 and is arranged on an inner side of the wiring line W4 between the pad P4 and the wiring substrate SUB3.

FIG. 2 is a diagram showing a basic structure and an equivalent circuit of the display panel PNL shown in FIG. 1.

The display panel PNL comprises a plurality of pixels PX in the display area DA. Here, each pixel indicates a minimum unit individually controllable according to a pixel signal, and exists in the region containing a switching element provided at a position where a scanning line and a signal line cross each other, for example, which will be described later. The pixels PX are arranged in a matrix along the first direction X and the second direction Y. Further, the display panel PNL comprises a plurality of scanning lines G (G1 to Gn), a plurality of signal lines S (S1 to Sm), common electrode CE, etc., in the display area DA. The scanning lines G each extend along the first direction X and are arranged along the second direction Y. The signal lines S each extend along the second direction Y and are arranged along the first direction X. The scanning lines G and the signal lines S are not necessarily formed to extend linearly, but may be partially bent. The common electrode CE is provided for a plurality of pixels PX. The scanning lines G, the signal lines S and the common electrodes CE are all drawn out to the non-display area NDA. In the non-display area NDA, the scanning lines G are connected to the scanning line driver GD, the signal lines S are connected to the signal line driver SD, and the common electrodes CE are connected to the common electrode driver CD. The signal line driver SD, the scanning line driver GD and the common electrode driver CD may be formed on the first substrate SUB1 or partially or entirely built in the IC chip I1 shown in FIG. 1.

Each pixel PX comprises a switching element SW, a pixel electrode PE, a common electrode CE, a liquid crystal layer LC, etc. The switching element SW is, for example, a thin film transistor (TFT) and is electrically connected to a respective scanning line G and a respective signal line S. More specifically, the switching element SW comprises a gate electrode WG, a source electrode WS and a drain electrode WD. The gate electrode WG is electrically connected to the scanning line G. In the example illustrated, the electrode electrically connected to the signal line S is referred to as the source electrode WS, and the electrode electrically connected to the pixel electrode PE is referred to as the drain electrode WD.

The scanning line G is connected to the switching element SW in each of those pixels PX which are arranged along the first direction X. The signal line S is connected to the switching element SW in each of those pixels PX arranged along the second direction Y. Each of the pixel electrodes PE opposes the common electrode CE and drives the liquid crystal layer LC with an electric field produced between the pixel electrode PE and the common electrode CE. A storage capacitor CS is formed, for example, between the common electrode CE and the pixel electrode PE.

FIG. 3 is a cross section showing a part of structures of the display area DA of the display panel PNL shown in FIG. 1. Here, a cross section of the display device DSP cut along the X-Z plane defined by the first direction X and the third direction Z is shown. The third direction Z is the direction from the first substrate SUB1 towards the second substrate SUB2.

The display panel PNL illustrated here has a structure provided for the display mode which mainly uses a lateral electric field substantially parallel to a surface of the substrate. The display panel PNL may have a structure provided for display mode using a vertical electric field perpendicular to the surface of the substrate, or an electric field oblique to the surface, or a combination thereof. To the display mode using a lateral electric field, for example, such a structure is applicable, that both of the pixel electrode PE and the common electrode CE are provided one of the first substrate SUB1 and the second substrate SUB2. To the display mode using a vertical electric field or an oblique electric field, for example, such a structure is applicable, that one of the pixel electrode PE and the common electrode CE is provided on the first substrate SUB1, and the other one of the pixel electrode PE and the common electrode CE is provided on the second substrate SUB2. Note that the surface of the substrate here is that parallel to the X-Y plane.

The first substrate SUB1 is formed using a first basement 10. The first basement 10 is formed, for example, from an insulating material such as glass or resin. The first basement 10 comprises a surface 10A opposing the second substrate SUB2 and a surface 10B on an opposite side to the surface 10A. The first substrate SUB1 comprises, on a surface 10A side of the first basement 10, signal lines S, a common electrode CE, metal layers M, pixel electrodes PE, a first insulating layer 11, a second insulating layer 12, a third insulating layer 13, a first alignment film AL1, etc. Note that the switching element, scanning lines, various insulating layers located between these, etc., are omitted from the illustration.

The first insulating layer 11 is located on the first basement 10. The scanning lines and the semiconductor layers of the switching elements not shown in the drawing are located between the first basement 10 and the first insulating layer 11. The signal lines S are located on the first insulating layer 11. The second insulating layer 12 is located on the signal lines S and the first insulating layer 11. The common electrode CE is located on the second insulating layer 12. The metal layers M are in contact with the common electrode CE at positions directly above the signal lines S, respectively. In the example illustrated, the metal layers M are located on the common electrode CE, but may be located between the common electrode CE and the second insulating layer 12. That is, it suffices if the metal layers M are in contact with the common electrode CE above the second insulating layer 12. The third insulating layer 13 is located on the common electrode CE and the metal layers M. The pixel electrodes PE are located on the third insulating layer 13. The pixel electrodes PE oppose the common electrode CE via the third insulating layer 13. The pixel electrodes PE each comprise a slit SL in a position opposing the common electrode CE. The first alignment film AL1 covers the pixel electrodes PE and the third insulating layer 13.

The scanning lines, the signal lines S and the metal layer M are formed of metal materials such as molybdenum, tungsten, titanium and aluminum and may be formed in a single or multi-layer structure. For example, the scanning lines are formed from a material containing molybdenum and tungsten, the signal lines S are formed from a material containing aluminum and titanium, and the metal layer M is formed from a material containing aluminum and molybdenum. The common electrode CE and the pixel electrode PE are each formed from a transparent conductive material such as indium tin oxide (ITO) or indium zinc oxide (IZO). The first insulating layer 11 and the third insulating layer 13 are inorganic insulating layers, and the second insulating layer 12 is an organic insulating layer.

Note that the structure of the first substrate SUB1 is not limited to the example illustrated, but the pixel electrodes PE may be located between the second insulating layer 12 and the third insulating layer 13 and the common electrode CE may be located between the third insulating layer 13 and the first alignment film AL1. In such a case, the pixel electrodes PE are each formed into a plate shape without a slit, and the common electrode CE is formed to comprise a slit which opposes the pixel electrode PE. Or, the pixel electrodes PE and the common electrode CE may be each formed into a comb teeth shape and arranged to engage with each other in gear.

The second substrate SUB2 is formed using a second basement 20. The second basement 20 is formed of, for example, an insulating material such as glass or resin. The second basement 20 comprises a surface 20A opposing the first substrate SUB1 and a surface 20B on an opposite side to the surface 20A. The second substrate SUB2 comprises, on a surface 20A side of the second basement 20, light-shielding layers BM, color filters CF, an overcoat layer OC, a second alignment film AL2, etc.

The light-shielding layers BM and the color filters CF are located on the surface 20A of the second basement 20. The light-shielding layers BM partition the pixels from each other and are located directly above the signal lines S, respectively. The color filters CF oppose the pixel electrodes PE and partially overlap the light-shielding layers BM. The color filter CF includes a red color filter, a green color filter, a blue color filter and the like. The overcoat layer OC covers the color filter CF. The second alignment film AL2 covers the overcoat layer OC.

The color filters CF may be disposed on the first substrate SUB1. The color filters CF may include color filters of four or more colors. On a pixel to display a white color, a white color filter or an uncolored resin material may be disposed or the overcoat layer OC may be disposed without disposing the color filter.

A detection electrode Rx is located on the surface 20B of the second basement 20. The detection electrode Rx corresponds to the second conductive layer L2, may be formed from a conductive layer containing a metal or a transparent conductive material such as ITO or IZO, or formed by depositing a transparent conductive layer on a conductive layer containing a metal, or formed of a conductive organic material or a dispersing element of fine conductive materials or the like.

A first optical element OD1 including a first polarizer PL1 is located between the first basement 10 and an illumination device BL. A second optical element OD2 including a second polarizer PL2 is located above the detection electrode Rx. Each of the first optical element OD1 and the second optical element OD2 may include a retardation film as needed.

Figure 4:
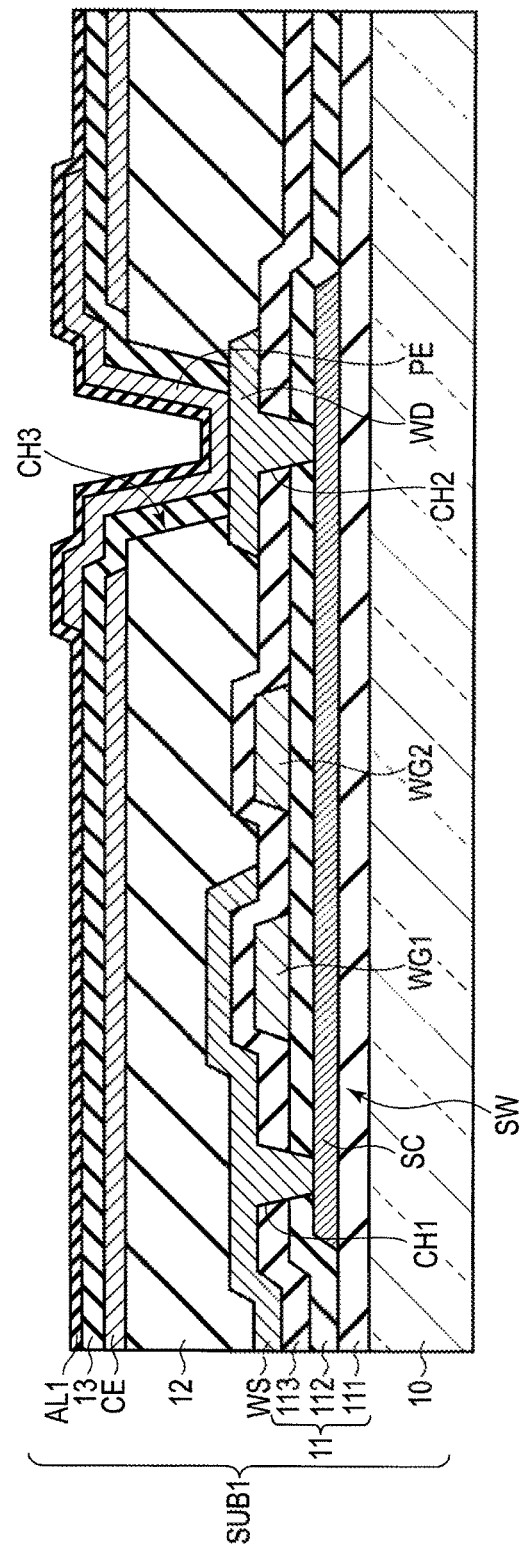
FIG. 4 is a cross section illustrating how a switching element SW and a pixel electrode PE are connected to each other.

FIG. 4 is a cross section illustrating how the switching element SW and the pixel electrode PE in the first substrate SUB1 are connected. Here, a double-gate type thin film transistor is shown as the switching element SW, but the switching element SW may be a single-gate type thin film transistor.

The semiconductor layer SC which constitutes the switching element SW is formed on the first inorganic insulating layer 111 as an undercoat layer, and is covered by the second inorganic insulating layer 112. Gate electrodes WG11 and WG12 are formed on the second inorganic insulating layer 112 and are covered by the third inorganic insulating layer 113. The source electrode WS and the drain electrode WD are formed on the third inorganic insulating layer 113. The source electrode WS and the drain electrode WD are connected to the semiconductor layer SC via a contact hole CH1 and a contact hole CH2 formed in the inorganic first insulating layer 111 and the second inorganic insulating layer 112, respectively. The first inorganic insulating layer 111, the second inorganic insulating layer 112 and the third inorganic insulating layer 113 correspond to the first insulating layer 11 shown in FIG. 3.

The second insulating layer 12 covers the source electrode WS and the drain electrode WD and is formed also on the third inorganic insulating layer 113. In the illustrated example, a contact hole CH3 penetrating through to the drain electrode WD is formed in the region of the second insulating layer 12, which overlaps the contact hole CH2. The common electrode CE is formed on the second insulating layer 12 except the region in which the contact hole CH3 is provided. The third insulating layer 13 covers the common electrode CE and is formed also on the second insulating layer 12. In the illustrated example, the third insulating layer 13 also covers the side surface of the contact hole CH3 and comprises a hole which at least partially exposes the drain electrode WD. The pixel electrode PE is in contact with the drain electrode WD via the contact hole CH3.

Next, a configuration example of the sensor SS built in the display device DSP of this embodiment will be explained. The sensor SS explained below is, for example, a capacitive sensor of a mutual-capacitive type, which detects contact or approach of an object, based on the variation in electrostatic capacitance between a pair of electrodes opposing via a dielectric.

FIG. 5 is a plan view showing a configuration example of the sensor SS.

In the configuration example illustrated, the sensor SS comprises sensor drive electrodes Tx and detection electrodes Rx. In the example illustrated, the sensor drive electrodes Tx correspond to portions hatched by lines downwardly slanting to the right and are provided on the first substrate SUB1. The detection electrodes Rx correspond to portions hatched by lines upwardly slanting to the right and are provided on the second substrate SUB2. The drive electrodes Tx and the detection electrodes Rx cross each other in the X-Y plane. The detection electrodes Rx oppose the sensor drive electrodes Tx along the third direction Z.

The sensor drive electrodes Tx and the detection electrodes Rx are located in the display area DA and some of the electrodes extend out to the non-display area NDA. In the example illustrated, the sensor drive electrodes Tx are each formed in a strip shape extending along the second direction Y and arranged along the first direction X to be spaced from each other. The detection electrodes Rx each extend along the first direction X and are arranged along the second direction Y to be spaced apart from each other. The detection electrodes Rx are connected to the pads provided on the first substrate SUB1 and electrically connected to the detection circuit RC via the wiring lines as explained with reference to FIG. 1. Each of the sensor drive electrodes Tx is electrically connected to the common electrode driver CD via a wiring line WR. The number, size and shape of the sensor drive electrodes Tx and the detection electrodes Rx are not particularly limited but can be variously changed.

The sensor drive electrodes Tx include the above-described common electrode CE, and have a function of generating an electric field between itself and the respective pixel electrode PE and also a function of detecting the position of the object by generating the capacitance between itself and the respective detection electrode Rx.

The common electrode driver CD supplies common drive signals to the sensor drive electrodes Tx including the common electrode CE at the display driving time to display images on the display area DA. Further, the common electrode driver CD supplies sensor drive signals to the sensor drive electrodes Tx at the sensing driving time to execute sensing. The detection electrodes Rx output sensor signals necessary for sensing (i.e., signals based on variation in inter-electrode capacitance between the sensor drive electrodes Tx and the detection electrodes Rx) in accordance with supply of the sensor drive signals to the sensor drive electrodes Tx. The detection signals output from the detection electrodes Rx are input to the detection circuit RC shown in FIG. 1.

The sensor SS in each of the above-explained configuration examples is not limited to the sensor of the mutual-capacitive type which detects the object based on the variation in electrostatic capacitance between a pair of electrodes (in the above case, the electrostatic capacitance between the sensor drive electrodes Tx and the detection electrodes Rx), but may be a self-capacitive type which detects an object based on the variation in electrostatic capacitance between the detection electrodes Rx.

Figure 6A:
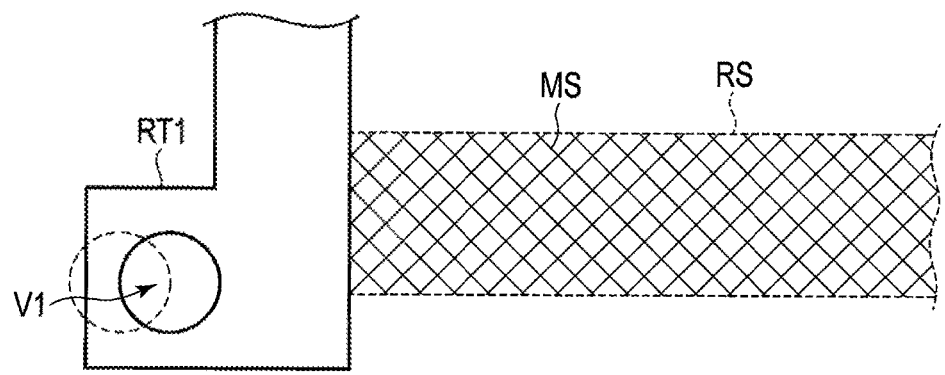
FIG. 6A is an expanded view showing a detection electrode of the display device shown in FIG. 1.
Figure 6B:
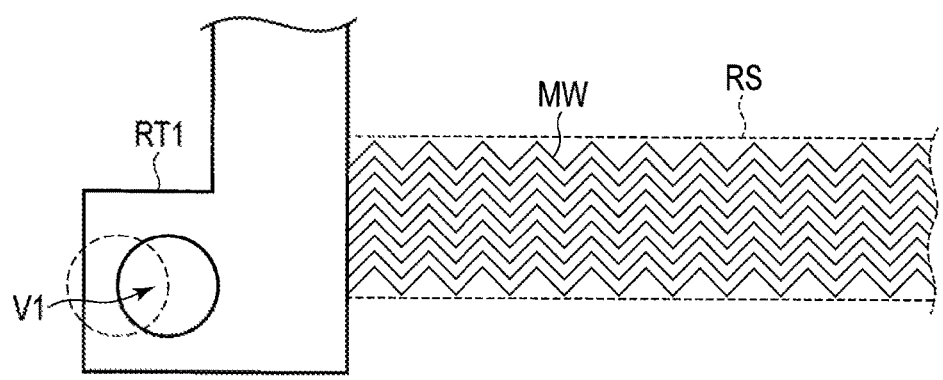
FIG. 6B is an expanded view showing another example of the detection electrode of the display device shown in FIG. 1.

FIGS. 6A and 6B are diagrams each showing a configuration example of a detector RS in the detection electrode Rx1 shown in FIG. 1.

In the example shown in FIG. 6A, the detector RS is formed of mesh-shaped metal wires MS. The metal wires MS are joined to the terminal RT1. In the example shown in FIG. 6B, the detector RS is formed of wave-shaped metal wires MW. In the example illustrated, the metal wires MW are formed in a sawtooth shape but may be in some other shape such as a sine wave shape. The metal wires MW are joined to the terminal RT1.

The terminal RT1 is formed of, for example, the same material as that of the detector RS. A circular contact hole V1 is formed in the terminal RT1. Note that the contact hole V1 may partially overlap the terminal RT1 as indicated by a circle of a dashed line.

FIGS. 7A and 7B are expanded view showing the vicinity of the pad P3 shown in FIG. 1.

In the illustrated example, the pad P3 is octagonal, but may be polygonal other than octagonal, or circular or elliptical, or any shape formed of straight and curved lines.

The pad P3 comprises a hole VB. In the example illustrated, the pad P3 comprises slits ST sandwiching the hole VB therebetween. With this structure, even if, for example, the sealant SE overlaps the pad P3, ultraviolet rays reach the sealant SE through the slits ST to harden the sealant SE by irradiation of ultraviolet rays and therefore the sealant can be reliably hardened. In the example shown in FIG. 7A, the slits ST are spaced from the hole VB. In the example shown in FIG. 7B, the slits ST are communicated to the hole VB. Note that the number of slits ST may be one or three or more, or may be omitted.

FIG. 8 is a cross section of the display panel PNL shown in FIG. 1 taken along line A-B, which includes a contact hole V3. Here, only the main parts necessary for the description is illustrated.

The first substrate SUB1 comprises, on a surface 10A side of the first basement 10, the pad P3 corresponding to the first conductive layer L1, the wiring line W1, the first insulating layer 11, the second insulating layer 12, the third insulating layer 13, a transparent conductive layer TC, the first alignment film AL1, etc.

The first insulating layer 11 has a multi-layer structure in which the first inorganic insulating layer 111, the second inorganic insulating layer 112 and the third inorganic insulating layer 113 are stacked in this order, and is formed on the surface 10A of the first basement 10, as described above. The first inorganic insulating layer 111 is formed under the semiconductor layer SC of the switching element SW in the display area DA. The second inorganic insulating layer 112 covers the semiconductor layer SC of the switching element SW in the display area DA. The third inorganic insulating layer 113 covers the gate electrode WG of the switching element SW and the scanning line G connected the gate electrode WG in the display area DA.

The second insulating layer 12 is formed on the third inorganic insulating layer 113. In this embodiment, the second insulating layer 12 may be referred to as a first organic insulating layer. In the example illustrated, the second insulating layer 12 is not provided in an edge on an opposite side to the display area DA along the first direction X (, which will be referred to as substrate edge portion hereafter), but it may be provided in the substrate edge. The second insulating layer 12 covers the source electrode WS and the drain electrode WD of the switching element SW and the signal line S electrically connected to the source electrode WS in the display area DA. Note that the second insulating layer 12 may be formed into an island-like shape in the region where the pad P3 is formed. That is, the second insulating layer 12 may include a first part formed in the region where the pad P3 is formed, and a second part spaced from the first part and located on a display area DA side.

The pad P3 is formed on the second insulating layer 12. The wiring line W1 is formed in the same layer as that of the pad P3. In other words, the wiring line W1 is provided on the second insulating layer 12 so as to be spaced from the pad P3 in the first direction X (that is, a direction approaching the display area DA). The pad P3 and the wiring line W1 are formed from the same material as that of the metal layer M shown in FIG. 3.

The third insulating layer 13 is formed on a display area DA side of the second insulating layer 12. In the example illustrated, the third insulating layer 13 is not formed in the region where the pad P3 is formed, but it may cover the pad P3. Further, the third insulating layer 13 is formed on the third inorganic insulating layer 113 in its substrate edge portion side.

The transparent conductive layer TC is overlaid on the third insulating layer 13. The transparent conductive layer TC having such configuration can be formed at the same time as that of the common electrode CE or the pixel electrode PE in the display area DA.

The first alignment film AL1 is provided from the display area DA to the substrate edge, and covers not only the transparent conductive layer TC, the third insulating layer 13 and the second insulating layer 12, but also the pad P3. In the example illustrated, the first alignment film AL1 is provided also in the slits ST of the pad P3, but may be removed from the slits ST. Further, the first alignment film AL1 need not cover the pad P3. Note that the transparent conductive layer TC is overlaid on the third insulating layer 13 as described above, which makes it possible to prevent the first alignment film AL1 from peeling off from the third insulating layer 13. The first alignment film AL1 covers the pixel electrode PE in the display area DA.

The second substrate SUB2 comprises, on the surface 20A of the second basement 20, the light-shielding layer BM, the overcoat layer OC, the second alignment film AL2, each of which are formed from a respective organic material, etc. The light-shielding layer BM and the overcoat layer OC are covered by the second alignment film AL2. The second substrate SUB2 comprises, on the surface 20B of the second basement 20, a detection electrode Rx3 corresponding to the second conductive layer L2. The detection electrode Rx3 is covered by a protection material PF. The protection material PF is formed, for example, from an organic insulating material such as acrylic resin.

The sealant SE is formed from an organic material and provided between the first alignment film AL1 and the second alignment film AL2. The sealant SE is located from the substrate edge to at least the region where the pad P3 is formed in plan view.

The liquid crystal layer LC is located in a gap between the first substrate SUB1 and the second substrate SUB2.

The contact hole V3 includes a hole VA penetrating the second basement 20, a hole VC penetrating the structure formed from the various organic materials and the second insulating layer 12, which are located between the second basement 20 and the first basement 10, a hole VB penetrating the pad P3, a hole VD penetrating the first insulating layer 11 and a concavity CC formed in the first basement 10. Here, the organic material-made structure corresponds the light-shielding layer BM, the overcoat layer OC, the second alignment film AL2, the sealant SE and the first alignment film AL1.

The hole VA has a tapered cross section, for example. The width of the hole VA in the surface 20B of the second basement 20 along the first direction X is greater than the width of the hole VA in the surface 20A along the first direction X.

The hole VC comprises a first part VC1, a second part VC2 and a third part VC3. The first part VC1 penetrates the organic material-made structure provided in the second substrate SUB2, that is, the light-shielding layer BM, the overcoat layer OC and the second alignment film AL2. The second part VC2 penetrates the sealant SE as an organic material-made structure. The third part VC3 penetrates the second insulating layer 12 as the first organic insulating layer provided in the first substrate SUB1. In the illustrated example, the second part VC2 penetrates the first alignment film AL1 as well. The third part VC3, the second part VC2 and the first part VC1 are arranged along the third direction Z in this order. The first part VC1 communicates to the hole VA, the second part VC2 communicates to first part VC1 and the hole VB, and the third part VC3 communicates to the holes VB and VD.

The hole VB is located between the second part VC2 and the third part VC3 of the hole VC and communicates to the second part VC2 and the third part VC3. In the example illustrated, the pad P3 projects in the hole VC. That is, the pad P3 has a region which is not covered by the sealant SE or the first alignment film AL1, and does not overlap the second insulating layer 12. This region will be described later with reference to FIG. 9.

The connecting material C is provided in the contact hole V3 to electrically connect the detection electrode Rx3 corresponding to the second conductive layer L2, and the pad P3 corresponding to the first conductive layer L1 to each other. The connecting material C is formed of a conductive material containing a metal material such as silver. The connecting material C should preferably contain fine particles of a metal material having a diameter of the order of from several nanometers to tens of nanometers. In the example illustrated, the connecting material C has a hollow, which is filled with an insulating filling material FI. The filling material FI partially covers the terminal RT3 of the detection electrode Rx3 in the second substrate SUB2. Note that the hollow may be filled with a conductive filling material. Or the connecting material C may fill the contact hole V3.

In the second substrate SUB2, the connecting material C partially overlaps the terminal RT3 and is in contact with the second basement 20 in the hole VA. The connecting material C is in contact with each of the organic material-made structures, the pad P3 projecting in the hole VC and the second insulating layer 12. In other words, the connecting material C is in contact with each of the light shielding layer BM, the overcoat layer OC and the second alignment film AL2 in the first part VC1 of the hole VC, with each of the sealant SE, the first alignment film AL1 and an upper surface P3A of the pad P3 in the second part VC2 of the hole VC, with a side surface of the pad P3 in the hole VB, and with a lower surface P3B of the pad P3 and the second insulating layer 12 in the third part VC of the hole VC. In the example illustrated and connecting material C also touches the first insulating layer 11 in third part VC3. Further, the connecting material C is in contact with each of the first inorganic insulating layer 111, the second inorganic insulating layer 112 and the third inorganic insulating layer 113 in the hole VD, and with the first basement 10 in the concavity CC. Note that the third part VC3 of the hole VC, the hole VD, the concavity CC and the VB need not be formed. That is, it suffices if the connecting material C passes through the first part VC1 and the second part VC2 of the hole VC to be electrically connected to the detection electrode Rx3 and the pad P3.

FIG. 9 is an expanded view showing the region encircled with alternate long and short dash lines shown in FIG. 8. The pad P3 comprises an edge portion PP facing the hole VC. For example, the edge portion PP has a rounded sectional shape and its thickness along the third direction Z is greater than the thickness of the region provided between the second insulating layer 12 and the first alignment film AL1. The connecting material C is formed so as to surround the edge portion PP.

According to the display device DSP comprising the sensor SS described above, the detection electrodes Rx provided in the second substrate SUB2 are connected to the pads P provided in the first substrate SUB1 by the connecting material C provided in the contact holes V. Therefore, it is no longer necessary to mount a wiring substrate on the second substrate SUB2 in order to connect the detection electrodes Rx and the detection circuit RC. That is, the wiring substrate SUB3 mounted on the first substrate SUB1 forms a transmission line for transmitting signals necessary to display images on the display panel PNL, and also a transmission line for transmitting signals between the detection electrodes Rx and the detector RC. Therefore, as compared to the configuration example which requires individual wiring substrates in addition to the wiring substrate SUB3, the number of wiring substrates can be reduced. Moreover, the space for connecting the wiring substrates to the second substrate SUB2 is not necessary, and therefore the non-display area of the display panel PNL, especially the width of the side edge in which the wiring substrate SUB3 is mounted can be decreased. Thereby, the width of the frame can be reduced.

Further, according to this embodiment, the pads P each comprise the edge portion PP projecting in the respective contact hole V, and therefore the contact area between the connecting material C and each pad P can be enlarged as compared to the case without projecting edge portions in the respective contact holes V. As shown in FIG. 9, when the edge portion PP of the pad P projecting in the contact hole V is thicker than the other regions, the contact area between the connecting material C and the pad P can be expanded further. Moreover, when the edge portion PP has a rounded sectional shape, the connecting material C does not easily break off near the pad P. Thereby, stable electrical characteristics can be obtained.

Second Embodiment

Figure 10:
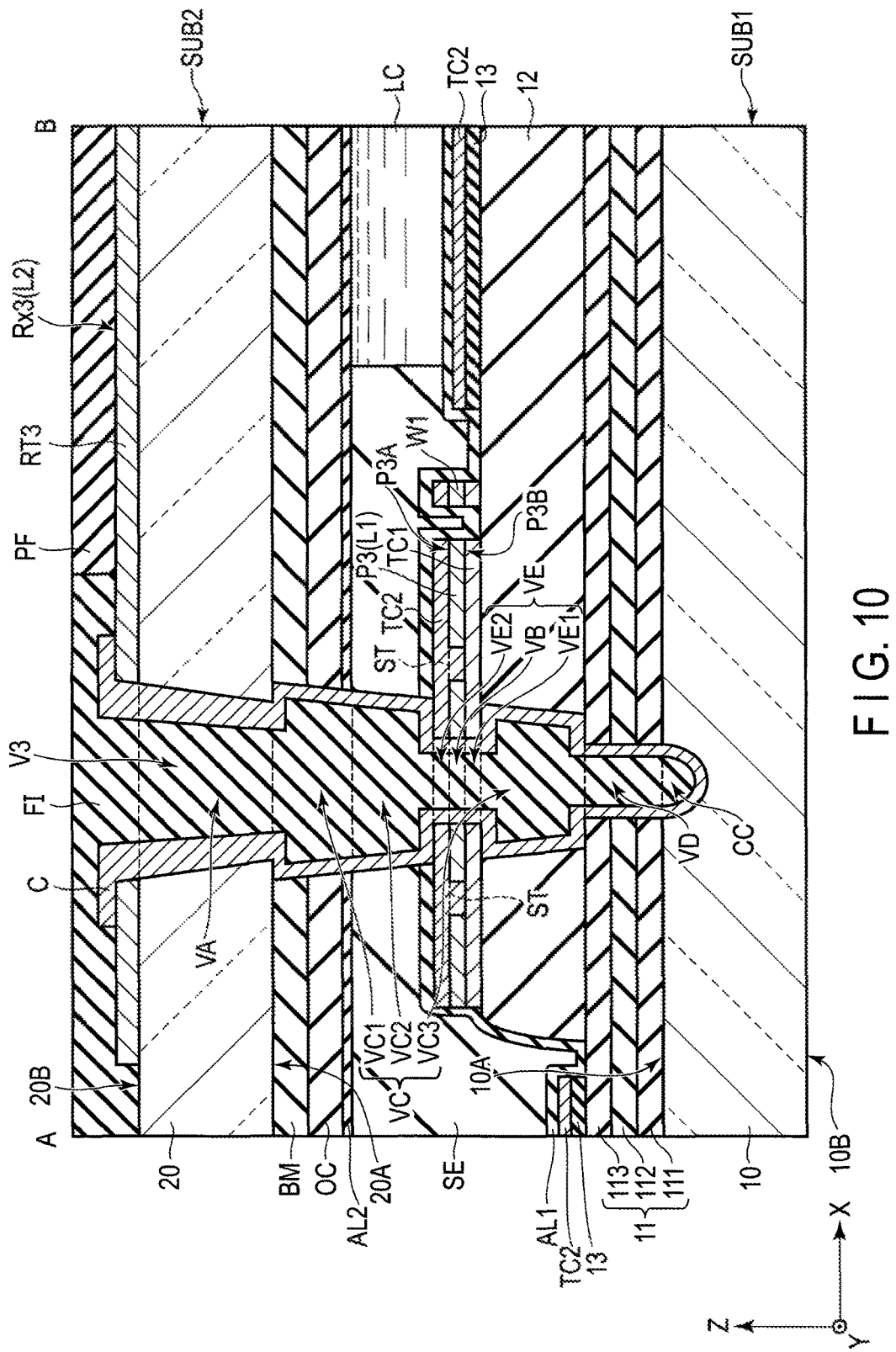
FIG. 10 is a cross section schematically showing a non-display area of a display device according to a second embodiment.

FIG. 10 is a cross section schematically showing a display device DSP according to the second embodiment. The second embodiment is different from the first embodiment in that the pad P3 is arranged between the first transparent conductive layer TC1 and the second transparent conductive layer TC2.

The first transparent conductive layer TC1 is formed on the second insulating layer 12. The pad P3 is formed on the first transparent conductive layer TC1. The second transparent conductive layer TC2 is formed on the pad P3. A lower surface P3B of the pad P3 is in contact with the first transparent conductive layer TC1, and an upper surface P3A of the pad P3 is in contact with the second transparent conductive layer TC2. In the example illustrated, the wiring line W1 as well is disposed between the first transparent conductive layer TC1 and the second transparent conductive layer TC2 as in the case of the pad P1. The first transparent conductive layer TC1 can be formed at the same time as that of the common electrode CE, for example, and the second transparent conductive layer TC2 can be formed at the same time as that of the pixel electrodes PE.

The first transparent conductive layer TC1 comprises a hole VE1 communicating to the hole VB and the third part VC3 of the hole VC. The second transparent conductive layer TC2 comprises a hole VE2 communicating to the hole VB and the second part VC2 of the hole VC. In this embodiment, the holes VE1, VB, and VE2 may be referred to as a hole VE. The hole VE communicates to the second part VC2 and the third part VC3.

In the example illustrated, the connecting material C is in contact with the upper surface of the second transparent conductive layer TC2 in the second part VC2 of the hole VC. Further, the connecting material C is in contact with each of the first transparent conductive layer TC1, the pad P3 and the second transparent conductive layer TC2 in the hole VE. That is, the connecting material C is in contact with a side surface of the first transparent conductive layer TC1 in the hole VE1, a side surface of the pad P3 in the hole VB, and a side surface of the second transparent conductive layer TC2 in the hole VE2. Further, the connecting material C is in contact with the lower surface of the first transparent conductive layer TC1 in the third part VC3 of the hole VC.

In the example illustrated, the first transparent conductive layer TC1 and the second transparent conductive layer TC2 are provided in the region where the pad P3 is formed, but may be provided in a range wider than the region where the pad P3 is formed, or provided so as to partially cover the pad P3. Or the first transparent conductive layer TC1 and the second transparent conductive layer TC2 may be provided in a range narrower than the region where the pad P3 is formed, for example, only in the region facing the contact hole V1. Furthermore, the first transparent conductive layer TC1 and the second transparent conductive layer TC2 may be removed from the region of the pad P3, where the slits ST thereof are formed. Note that one of the first transparent conductive layer TC1 and the second transparent conductive layer TC2 may be omitted.

According to the second embodiment, not only an advantageous effect similar to the first embodiment described above can be obtained, but also oxidization of the pad P3 can be suppressed because the pad P3 is covered by a conductive material formed of an oxide. Therefore, it is possible to inhibit the decrease in the conductivity between the first conductive layer L1 and the second conductive layer L2. Moreover, since the pad P3 is in contact with the first transparent conductive layer TC1 and the second transparent conductive layer TC2 and is electrically connected to both. The first transparent conductive layer TC1 and the connecting material C are brought into contact with each other in the hole VE1, and the second transparent conductive layer TC2 and the connecting material C are brought into contact with each other in the hole VE2. With this structure, the contact area between the pad P3 and the connecting material C can be substantially expanded. As a result, stable electrical characteristics can be obtained.

Third Embodiment

Figure 11:
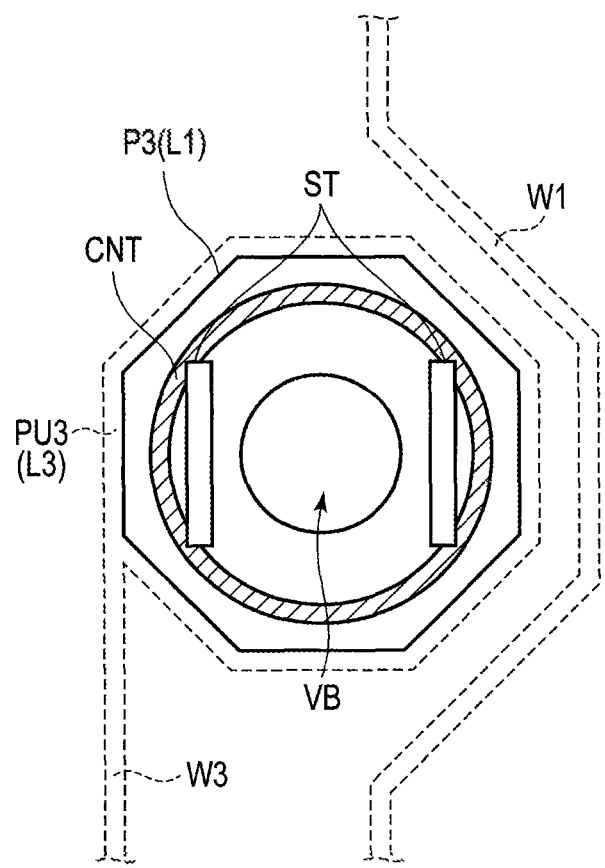
FIG. 11 is a plan view schematically showing the vicinity of a pad of a display device according to a third embodiment.

FIG. 11 is a plan view schematically showing the vicinity of a pad P3 of a display device DSP according to the third embodiment. The third embodiment is different from the first or second embodiment in that the second pad PU3 as the third conductive layer L3 is provided under the pad P3 and the pad P3 and a second pad PU3 are electrically connected to each other.

The second pad PU3 has a shape similar to that of the pad P3, for example. In the example illustrated, the second pad PU3 comprises slits ST formed in positions which respectively overlap the slits ST of the pad P3. In this embodiment, the wiring line W3 is connected to the second pad PU3, but not to the pad P3. The pad P3 comprises an annular contact region (to be also referred to as a contact part) CNT hatched by lines upwardly slanting to the right in FIG. 11. The contact region CNT is in contact with the second pad PU3.

Figure 12:
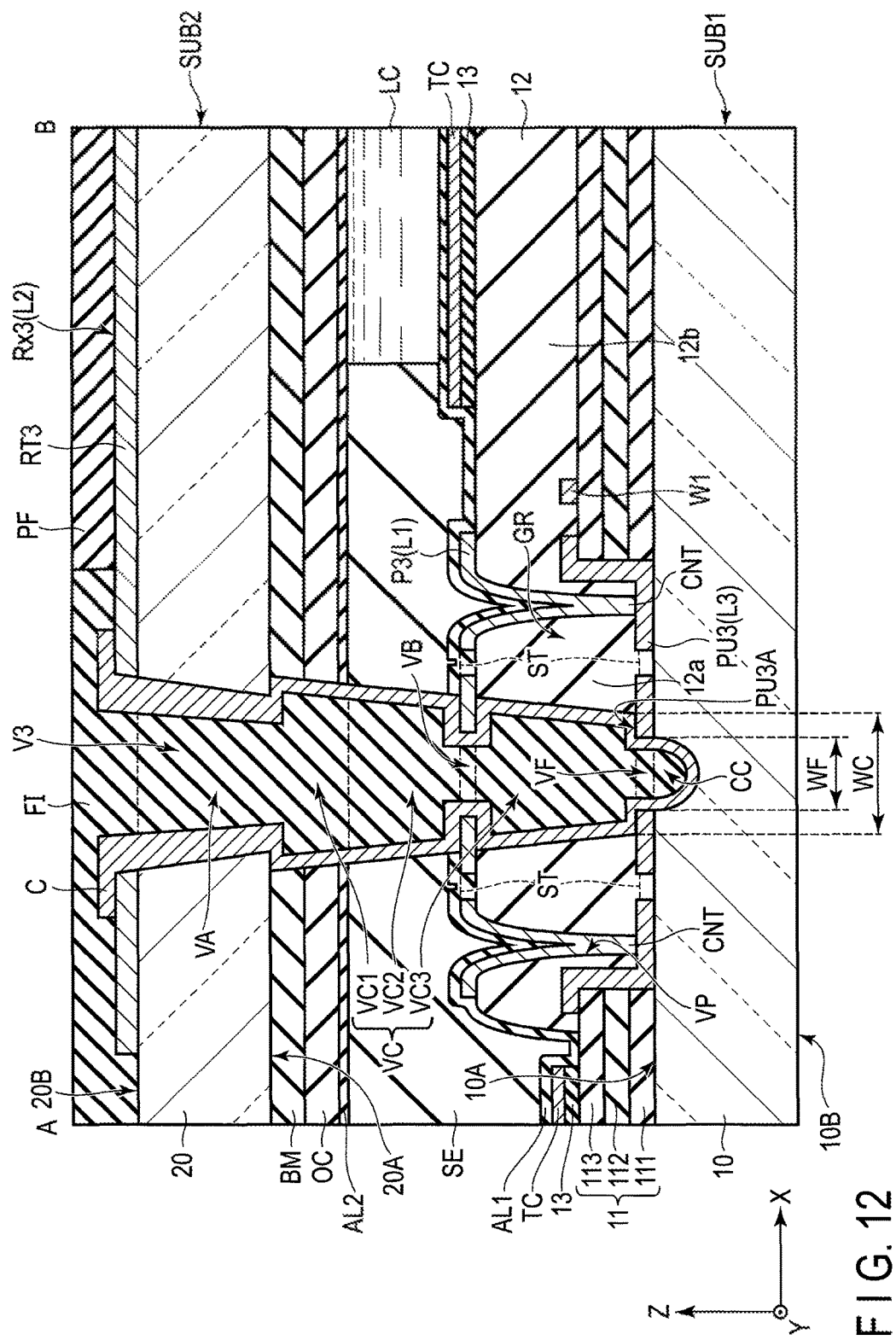
FIG. 12 is a cross section schematically showing the non-display area of the display device according to the third embodiment.

FIG. 12 is a cross section schematically showing a display device DSP according to the third embodiment.

A second pad PU3 is formed in a surface 10A of the first basement 10. That is, the first insulating layer 11 comprises a concavity GR penetrating a first inorganic insulating layer 111, a second inorganic insulating layer 112 and a third inorganic insulating layer 113 to the first basement 10. The second pad PU3 is formed in the concavity GR to be in contact with the surface 10A. In the example illustrated, the second pad PU3 is in contact also with a side surface of the first inorganic insulating layer 111, a side surface of the second inorganic insulating layer 112, a side surface of the third inorganic insulating layer 113, and an upper surface of the third inorganic insulating layer 113. The second pad PU3 and the wiring line W1 are formed from the same material as that of the signal lines S shown in FIG. 3. The wiring line W1 and the like are formed on the third inorganic insulating layer 113.

It suffices if the second pad PU3 is located between the first basement 10 and the second insulating layer 12, and it may be formed on any of the first inorganic insulating layer 111, the second inorganic insulating layer 112 and the third inorganic insulating layer 113. When the second pad PU3 is formed on the first inorganic insulating layer 111, a semiconductor layer may be interposed between the first inorganic insulating layer 111 and the second pad PU3. Such a semiconductor layer can be formed at the same time as that of the semiconductor layer SC of the switching element SW in the display area DA.

The second pad PU3 comprises a hole VF communicating to a third part VC3 of the hole VC and the concavity CC. In the example illustrated, a width WC of the third part VC3 in the upper surface PU3A of the second pad PU3 along the first direction X is greater than a width WF of the hole VF along the first direction X.

The connecting material C is in contact with the upper surface PU3A of the second pad PU3 in the third part VC3 of the hole VC. Further, the connecting material C is in contact with a side surface of the second pad PU3 in the hole VF.

The second insulating layer 12 comprises a hole VP spaced from the third part VC3 of the hole VC. In this embodiment, the hole VP is formed into an annular shape surrounding the third part VC3 of the hole VC in plan view. That is, the hole VP is located in a region overlapping the contact region CNT shown in FIG. 11. Thus, the second insulating layer 12 is divided into a first part 12a surrounded by the hole VP and a second part 12b spaced from the first part 12a and provided on the display area DA side.

The pad P3 is formed on the first part 12a, and also partially on the second part 12b. The pad P3 is in contact with the second pad PU3 by the contact part CNT via the hole VP. The hole VP need not be formed into an annular shape, but may be of any shape as long as the pad P3 and the second pad PU3 can be electrically connected to each other.

According to the third embodiment, the pad P3 is brought into contact with the second pad PU3 via the hole VP, and both of these are electrically connected to each other. The connecting material C is brought into contact with the second pad PU3 in the third part VC3 of the hole VC and the hole VF. Thus, the contact area between the pad P3 and the connecting material C can be substantially expanded. Thereby, stable electrical characteristics can be obtained.

Furthermore, since the first part 12a and the second part 12b of the second insulating layer 12 are separated from each other, it is possible to inhibit the entering of moisture to the second part 12b on the display area DA side through the second insulating layer 12 from the first part 12a. Therefore, degradation of the elements provided in the display area DA can be suppressed.

In each of the above-described embodiments, the hole VA corresponds to the first hole, the first part VC1 and the second part VC2 correspond to the second hole, the hole VB or VE corresponds to the third hole, the third part VC3 corresponds the fourth hole and the hole VP corresponds to the fifth hole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate including a first glass substrate having a concavity, a scanning line and a signal line, arranged in a display area which displays images, a first organic insulating layer covering the signal line and the scanning line, a metal layer provided above the first organic insulating layer in the display area, and a first conductive layer arranged in a peripheral area surrounding the display area and formed from a same material as that of the metal layer;
a second substrate including a second glass substrate opposing the first glass substrate and spaced therefrom, and a second conductive layer;
a sealant provided in the peripheral area;
a contact hole; and
a connecting material, wherein
the second glass substrate has a first surface opposing the first substrate and a second surface on an opposite side to the first surface,
the second conductive layer is formed on the second surface,
the first conductive layer is formed between the first organic insulating layer and the sealant,
the contact hole penetrates from the second conductive layer to the concavity of the first glass substrate through the sealant and the first conductive layer, and
the connecting material connects the first conductive layer and the second conductive layer via the contact hole.

2. The display device of claim 1, wherein the contact hole has a first diameter and a second diameter,
the first diameter is a diameter of a part of the contact hole formed in the first conductive layer,
the second diameter is a diameter of a part of the contact hole formed in the concavity, and
the first diameter is larger than a second diameter.

3. The display device of claim 2, further comprising a pixel electrode, a common electrode and an inorganic insulating layer in the display area, wherein
the first organic insulating layer and the inorganic insulating layer expand from the display area to the peripheral area, the metal layer is in contact with the common electrode, the common electrode is formed between the organic insulating layer and the inorganic insulating layer, and the pixel electrode is formed on the inorganic insulating layer, and
the first conductive layer is formed between the first organic insulating layer and the inorganic insulating layer.

4. The display device of claim 3, wherein
the first organic insulating layer comprises a first part located in the peripheral region, and a second part located in the display area and covering the signal line,
the first part is spaced from the second part,
the first part overlaps the sealant, and
the first conductive layer is formed on the first part.

5. The display device of claim 4, further comprising a light shielding layer and a color filter located between the first conductive layer and the second glass substrate, wherein
- the contact hole penetrates the light shielding layer and the color filter,
- the contact hole further has a third diameter and a fourth diameter, the third diameter is a diameter of a part of the contact hole formed in the first surface of the second glass substrate, the fourth diameter is a diameter of a part of the contact hole formed in the light shielding layer or the color filter, and the third diameter is greater than the fourth diameter.

6. The display device of claim 5, wherein the first diameter is less than the third diameter.

7. The display device of claim 6, wherein the contact hole penetrates the first organic insulating layer, the contact hole further has a fifth diameter in the organic insulating layer, and the fifth diameter is greater than the first diameter.

8. The display device of claim 7, further comprising a third conductive layer provided between the first glass substrate and the first organic insulating layer, wherein
- the third conductive layer is electrically connected to the first conductive layer,
- the contact hole penetrates the third conductive layer, and
- the connecting material is in contact with the third conductive layer.

9. The display device of claim 8, wherein the third conductive layer is formed from a same material as that of the signal line.

10. The display device of claim 8, wherein
- the first organic insulating layer comprises a concavity spaced from the contact hole formed in the organic insulating layer, and
- the first conductive layer is in contact with the third conductive layer via the concavity of the first organic insulating layer.

11. The display device of claim 10, wherein the concavity of the first organic insulating layer is formed into an annular shape which surrounds the contact hole in plan view, and the first part is surrounded by the concavity of the first organic insulating layer in plan view.

12. The display device of claim 2, wherein the first conductive layer comprises a first slit, and the first slit overlaps the sealant and is located around the contact hole of the first conductive layer.

13. The display device of claim 6, wherein the first conductive layer comprises a first slit, and the contact hole communicates to the first slit.

14. The display device of claim 8, wherein the first conductive layer comprises a first slit, and the third conductive layer comprises a second slit in a position overlapping the first slit.

15. The display device of claim 2, further comprising:
- a first transparent conductive layer provided between the first conductive layer and the first organic insulating layer; and
- a second transparent conductive layer overlaid on the first conductive layer, wherein
- a first transparent electrode is formed from a same material as that of a common electrode, and a second transparent electrode is formed from a same material as that of a pixel electrode, and
- the contact hole penetrates the first transparent electrode and the second transparent electrode.

16. The display device of claim 15, wherein the contact hole penetrates the sealant, the contact hole has a third diameter in the sealant, and the third diameter is greater than the first diameter.

17. The display device of claim 16, wherein the connecting material is in contact with each of the second transparent conductive layer, the first conductive layer and the first transparent conductive layer in the contact hole.

18. The display device of claim 17, wherein the contact hole penetrates the first organic insulating layer, the contact hole has a fourth diameter in the first organic insulating film, and the fourth diameter is greater than the second diameter.

* * * * *